(12) United States Patent
Chandrasekhar et al.

(10) Patent No.: US 8,482,975 B2
(45) Date of Patent: Jul. 9, 2013

(54) MEMORY KINK CHECKING

(75) Inventors: Uday Chandrasekhar, San Jose, CA (US); Mark Helm, Santa Cruz, CA (US)

(73) Assignee: Micron Technology, Inc., Boise, ID (US)

( * ) Notice: Subject to any disclaimer, the term of this patent is extended or adjusted under 35 U.S.C. 154(b) by 553 days.

(21) Appl. No.: 12/559,275

(22) Filed: Sep. 14, 2009

(65) Prior Publication Data

US 2011/0063919 A1   Mar. 17, 2011

(51) Int. Cl.
*G11C 11/34* (2006.01)
(52) U.S. Cl.
USPC .................................. 365/185.02; 365/185.18
(58) Field of Classification Search
USPC ............. 365/185.02, 185.18, 185.22, 185.24, 365/185.26
See application file for complete search history.

(56) References Cited

U.S. PATENT DOCUMENTS

| | | | |
|---|---|---|---|
| 6,956,770 B2 * | 10/2005 | Khalid et al. ............ 365/185.12 |
| 7,057,934 B2 | 6/2006 | Krishnamachari et al. |
| 7,064,980 B2 | 6/2006 | Cernea et al. |
| 7,215,574 B2 | 5/2007 | Khalid et al. |
| 7,231,537 B2 | 6/2007 | Nobunaga |
| 7,269,069 B2 | 9/2007 | Cernea et al. |
| 7,324,383 B2 | 1/2008 | Incarnati et al. |
| 7,432,552 B2 | 10/2008 | Park et al. |
| 7,532,514 B2 | 5/2009 | Cernea et al. |
| 8,243,521 B2 * | 8/2012 | Moschiano et al. ..... 365/185.19 |
| 2005/0057967 A1 | 3/2005 | Khalid et al. |
| 2007/0140006 A1 | 6/2007 | Chen et al. |
| 2007/0263449 A1 | 11/2007 | Yu et al. |
| 2008/0019185 A1 | 1/2008 | Li |
| 2008/0151633 A1 | 6/2008 | Park et al. |
| 2008/0181014 A1 | 7/2008 | Lee |
| 2008/0239806 A1 | 10/2008 | Moschiano et al. |
| 2009/0003061 A1 | 1/2009 | Helm |
| 2009/0067236 A1 | 3/2009 | Isobe et al. |
| 2009/0109743 A1 | 4/2009 | Goda et al. |
| 2009/0109744 A1 | 4/2009 | Aritome |
| 2009/0109746 A1 | 4/2009 | Aritome |
| 2009/0109759 A1 | 4/2009 | Aritome |
| 2009/0113259 A1 | 4/2009 | Aritome |

OTHER PUBLICATIONS

International Search Report and Written Opinion for related PCT Application PCT/US2010/002378 mailed May 27, 2011 (10 pages).
Korean Notice of Preliminary Rejection for related Korean Application No. 10-2012-7007290, mailed Apr. 13, 2013, (11 pgs.).

* cited by examiner

*Primary Examiner* — Douglas King
(74) *Attorney, Agent, or Firm* — Brooks, Cameron & Huebsch, PLLC

(57) ABSTRACT

This disclosure concerns memory kink checking. One embodiment includes selectively applying one of a plurality of voltages to a first data line according to a programming status of a first memory cell, wherein the first memory cell is coupled to the first data line and to a selected access line. An effect on a second data line is determined, due at least in part to the voltage applied to the first data line and a capacitive coupling between at least the first data line and the second data line, wherein the second data line is coupled to a second memory cell, the second memory cell is adjacent to the first memory cell, and the second memory cell is coupled to the selected access line. A kink correction is applied to the second data line, responsive to the determined effect, during a subsequent programming pulse applied to the second memory cell.

49 Claims, 7 Drawing Sheets

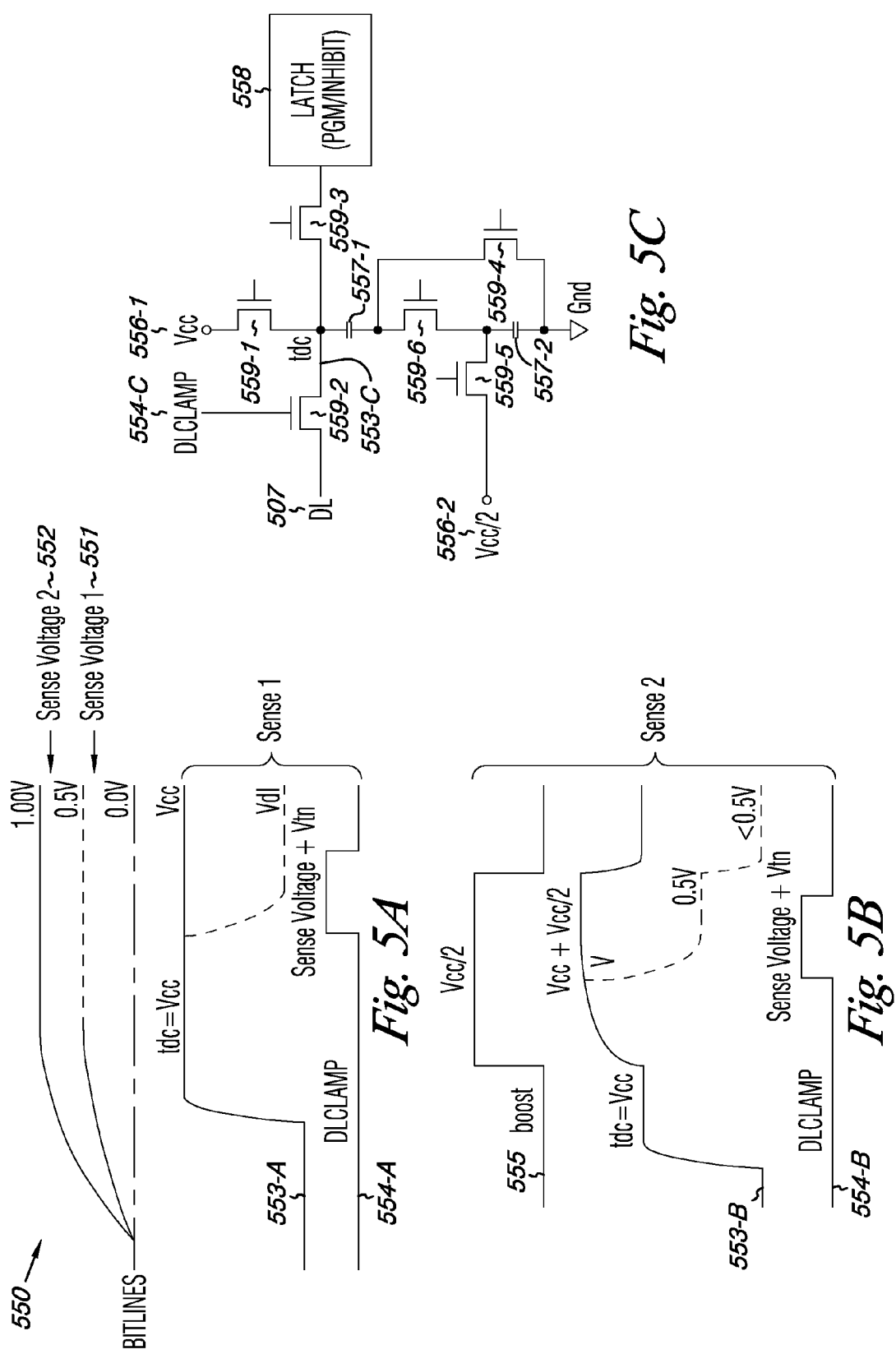

MEMORY KINK CHECKING

TECHNICAL FIELD

The present disclosure relates generally to semiconductor memory devices, methods, and systems, and more particularly, to memory kink checking.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), and flash memory, among others.

Flash memory devices, including floating gate flash devices and charge trap flash (CTF) devices using semiconductor-oxide-nitride-oxide-semiconductor and metal-oxide-nitride-oxide-semiconductor capacitor structures that store information in charge traps in the nitride layer, may be utilized as non-volatile memory for a wide range of electronic applications. Flash memory devices typically use a one-transistor memory cell that allows for high memory densities, high reliability, and low power consumption.

Uses for flash memory include memory for sold state drives (SSDs), personal computers, personal digital assistants (PDAs), digital cameras, cellular telephones, portable music players, e.g., MP3 players, and movie players. Data, such as program code, user data, and/or system data, such as a basic input/output system (BIOS), are typically stored in flash memory devices. This data may be used in personal computer systems, among others. Some uses of flash memory may include multiple reads of data programmed to a flash memory device without erasing the data.

Two common types of flash memory array architectures are the "NAND" and "NOR" architectures, so called for the logical form in which the basic memory cell configuration of each is arranged. A NAND array architecture arranges its array of memory cells in a matrix such that the control gates of each memory cell in a "row" of the array are coupled to (and in some cases form) an access line, which is commonly referred to in the art as a "word line". However each memory cell is not directly coupled to a data line (which is commonly referred to as a digit line, e.g., a bit line, in the art) by its drain. Instead, the memory cells of the array are coupled together in series, source to drain, between a common source and a data line, where the memory cells commonly coupled to a particular data line are referred to as a "column".

Memory cells in a NAND array architecture may be programmed to a desired state. For example, electric charge can be placed on or removed from a charge storage node, such as a floating gate, of a memory cell to put the cell into one of a number of programmed states. For example, a single level cell (SLC) can represent two states, e.g., 1 or 0. Flash memory cells can also store more than two states, e.g., 1111, 0111, 0011, 1011, 1001, 0001, 0101, 1101, 1100, 0100, 0000, 1000, 1010, 0010, 0110, and 1110. Such cells may be referred to as multilevel cells (MLCs). MLCs may allow the manufacture of higher density memories without increasing the number of memory cells since each cell can represent more than one digit, e.g., more than one bit. For example, a cell capable of representing four digits can have sixteen programmed states. For some MLCs, one of the sixteen programmed states may be an erased state. For these MLCs, the lowermost programmed state is not programmed above the erased state, that is, if the cell is programmed to the lowermost state, it remains in the erased state rather than having a charge applied to the cell during a programming operation. The other fifteen programmed states may be referred to as "non-erased" states.

Some memory devices including NAND arrays may be programmed such that not all of the cells coupled to a particular access line are programmed at the same time, e.g., as in shielded bit line (SBL) programming, which may include separately programming alternate cells coupled to a particular access line. Some memory devices including NAND arrays may be programmed such that all of the cells coupled to a particular access line are programmed simultaneously, such as in all bit line (ABL) programming. In ABL programming, capacitive coupling between adjacent memory cells can have adverse effects on the memory cell being programmed. However, ABL programming can provide faster programming operations with respect to SBL programming, as all of the cells coupled to a particular access line can be programmed at the same time.

BRIEF DESCRIPTION OF THE DRAWINGS

FIG. 5A is a timing diagram associated with a first kink checking operation according to one or more embodiments of the present disclosure.

FIG. 5B is a timing diagram associated with a second kink checking operation according to one or more embodiments of the present disclosure.

FIG. 5C is a schematic of sensing circuitry according to one or more embodiments of the present disclosure.

DETAILED DESCRIPTION

Figure 1:
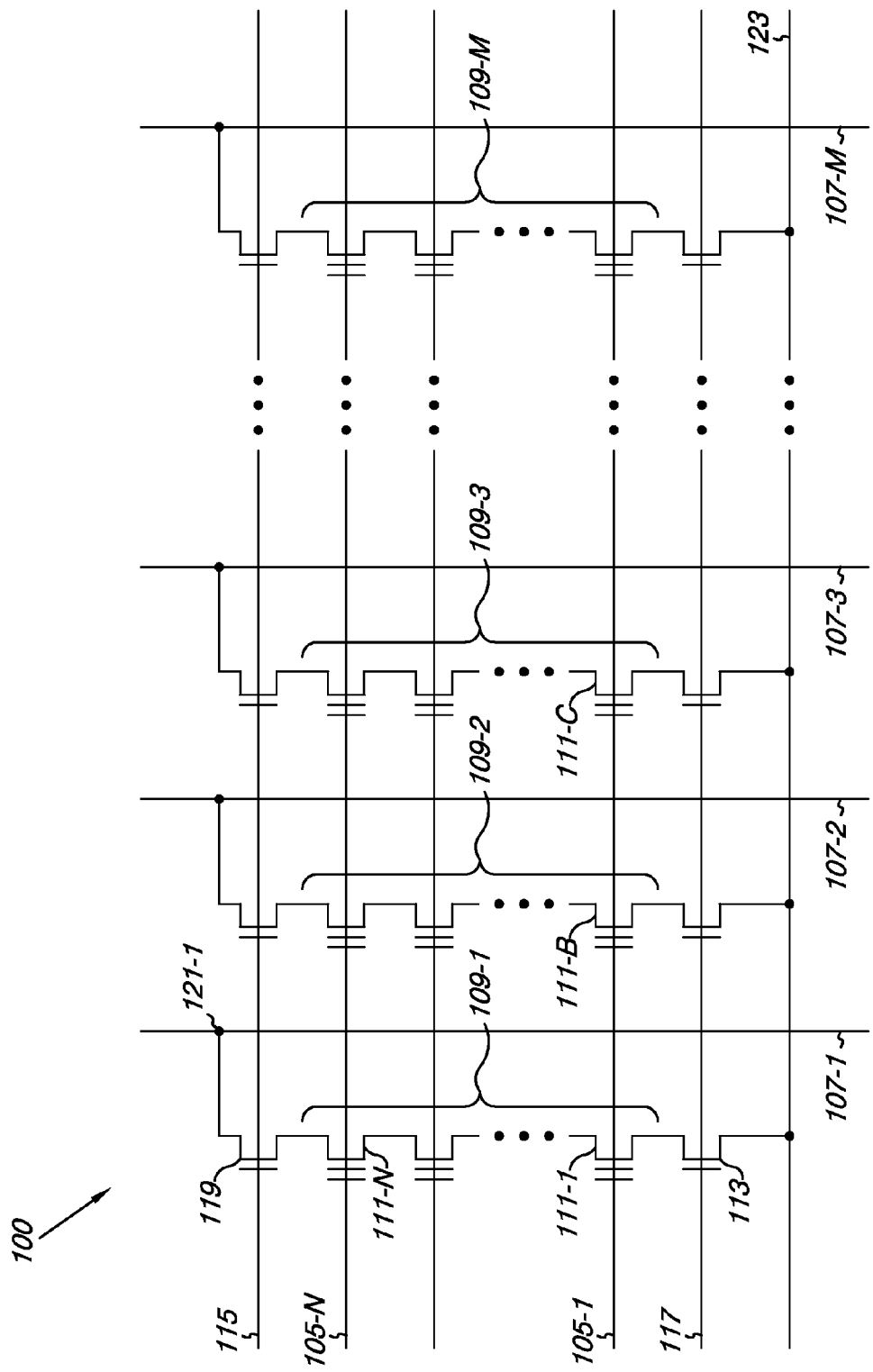
FIG. 1 is a schematic of a portion of a non-volatile memory array in accordance with one or more embodiments of the present disclosure.

The present disclosure includes methods, devices, modules, and systems for operating semiconductor memory. One method embodiment includes selectively applying one of a plurality of, e.g., two, voltages to a first data line according to a programming status of a first memory cell (where the first memory cell is coupled to the first data line and to a selected access line). An effect on a second data line is determined due at least in part to the voltage applied to the first data line and a capacitive coupling between at least the first data line and the second data line (where a second memory cell is coupled to the second data line, and the second memory cell is adjacent to the first memory cell and is coupled to the selected access line). A kink correction is applied to the second data line, responsive to the determined effect, during a subsequent programming pulse applied to the second memory cell.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N" and "M," particularly with respect to reference numerals in the drawings, indicate that a number of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 111 may reference element "11" in FIG. 1, and a similar element may be referenced as 211 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a schematic of a portion of a non-volatile memory array 100 in accordance with one or more embodiments of the present disclosure. The embodiment of FIG. 1 illustrates a NAND architecture non-volatile memory. However, embodiments described herein are not limited to this example. As shown in FIG. 1, the memory array 100 includes access lines, e.g., word lines 105-1, . . . , 105-N and corresponding data lines, e.g., local bit lines 107-1, 107-2, 107-3, . . . , 107-M. For ease of addressing in the digital environment, the number of word lines 105-1, . . . , 105-N and the number of local bit lines 107-1, 107-2, 107-3, . . . , 107-M can be some power of two, e.g., 256 word lines by 4,096 bit lines.

Memory array 100 includes NAND strings 109-1, 109-2, 109-3, . . . , 109-M. Each NAND string includes non-volatile memory cells 111-1, . . . , 111-N, each associated with a respective word line 105-1, . . . , 105-N. Each NAND string (and its constituent memory cells) is also associated with a local bit line 107-1, 107-2, 107-3, . . . , 107-M. The non-volatile memory cells 111-1, . . . , 111-N of each NAND string 109-1, 109-2, 109-3, . . . , 109-M are connected in series source to drain between a source select gate (SGS), e.g., a field-effect transistor (FET) 113, and a drain select gate (SGD), e.g., FET 119. Each source select gate 113 is configured to selectively couple a respective NAND string 109 to a common source 123 responsive to a signal on source select line 117, while each drain select gate 119 is configured to selectively couple a respective NAND string to a respective bit line 107 responsive to a signal on drain select line 115. Memory cells 111-1, 111-B, and 111-C are all coupled to word line 105-1, and are associated with bit lines 107-1, 107-2, and 107-3 respectively.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local bit line 107-1 for the corresponding NAND string 109-1 at drain contact 121-1. The source of drain select gate 119 is connected to the drain of the last memory cell 111-N, e.g., a floating-gate transistor, of the corresponding NAND string 109-1.

In one or more embodiments, construction of non-volatile memory cells, 111-1, . . . , 111-N, includes a source, a drain, a floating gate or other charge storage node, and a control gate. Non-volatile memory cells, 111-1, . . . , 111-N, have their control gates coupled to a word line, 105-1, . . . , 105-N respectively. A "column" of the non-volatile memory cells, 111-1, . . . , 111-N, make up the NAND strings, e.g., 109-1, 109-2, 109-3, . . . , 109-M, and are coupled to a given local bit line, e.g., 107-1, 107-2, 107-3, . . . , 107-M respectively. A "row" of the non-volatile memory cells are those memory cells commonly coupled to a given word line, e.g., 105-1, . . . , 105-N. The use of the terms "column" and "row" is not meant to imply a particular linear, e.g., vertical and/or horizontal, orientation of the non-volatile memory cells. A NOR array architecture would be similarly laid out, except that the string of memory cells would be coupled in parallel between the select gates.

As one of ordinary skill in the art will appreciate, subsets of cells coupled to a selected word line, e.g., 105-1, . . . , 105-N, can be programmed and/or sensed, e.g., read, together as a group. A programming operation, e.g., a write operation, can include applying a number of program pulses, e.g., 16V-20V, to a selected word line in order to increase the threshold voltage (Vt) of selected cells coupled to that selected word line to a desired program voltage level corresponding to a desired programmed state.

A sensing operation, such as a read or program verify operation, can include sensing a voltage and/or current change of a bit line coupled to a selected cell in order to determine the state of the selected cell. The sensing operation can involve applying, e.g., biasing or driving, a voltage to a bit line, e.g., bit line 107-1, associated with a selected memory cell above a voltage applied to a source, e.g., source line 123, associated with the selected memory cell. A sensing operation could alternatively include precharging the bit line 107-1 followed with discharge when a selected cell begins to conduct, and sensing the discharge.

Sensing the state of a selected cell can include applying one or more sensing voltages, e.g., read voltages "Vread," to a selected word line while applying one or more voltages to the word lines coupled to the unselected cells of the string sufficient to place the unselected cells in a conducting state independent of the threshold voltage of the unselected cells, e.g., pass voltages "Vpass". The bit line corresponding to the selected cell being read and/or verified can be sensed to determine whether or not the selected cell conducts in response to the particular sensing voltage applied to the selected word line. For example, the state of a selected cell can be determined by the word line voltage at which the bit line current reaches a particular reference current associated with a particular state.

As one of ordinary skill in the art will appreciate, in a sensing operation performed on a selected memory cell in a NAND string, the unselected memory cells of the string are biased so as to be in a conducting state. In such a sensing operation, the data stored in the selected cell can be based on the current and/or voltage sensed on the bit line corresponding to the string. For instance, data stored in the selected cell can be based on whether the bit line current changes by a particular amount or reaches a particular level in a given time period.

When the selected cell is in a conductive state, current flows between the source line contact at one end of the string and a bit line contact at the other end of the string. As such, the current associated with sensing the selected cell is carried through each of the other cells in the string, the diffused regions between cell stacks, and the select transistors.

A program verify operation can include applying one or more program verify voltages to a selected word line, e.g., after a programming pulse, to determine whether a memory cell coupled to the selected word line has reached a desired programmed state. In association with the program verify operation, a cache element can store a programming status of the selected memory cell, e.g., whether the selected memory cell has reached the desired programmed state. For example, the programming status of the selected memory cell can include one of programming complete and programming incomplete. Prior to performing the program verify operation, the programming status of the selected memory cell can be programming incomplete. If the program verify operation verifies that the selected memory cell has reached a desired programmed state, then the programming status, stored in the cache element, can be changed from programming incomplete to programming complete. Such a change in programming status can affect whether or not the selected memory cell will be program inhibited during subsequent programming pulse. For example, if the programming status stored in the cache element is programming incomplete, then the selected memory cell will not be program inhibited during a subsequent programming pulse applied to the selected word line. However, if the programming status stored in the cache element is programming complete, then the selected memory cell will be program inhibited during a subsequent programming pulse applied to the selected word line.

Figure 2:
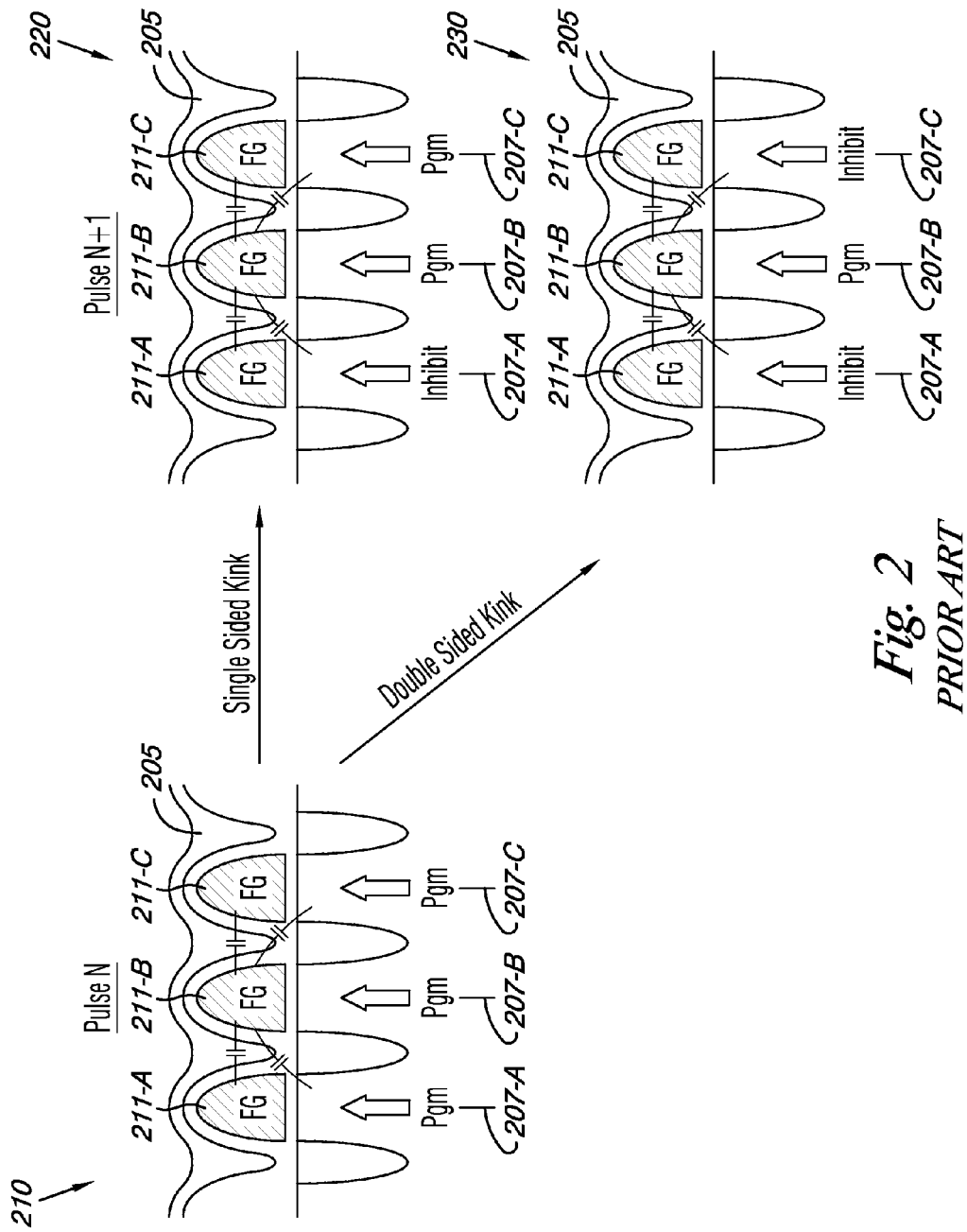
FIG. 2 illustrates capacitive coupling and programming kink during a programming operation.

FIG. 2 illustrates capacitive coupling and programming kink during a programming operation. The first image 210 illustrates a first programming pulse, e.g., "Pulse N." The second image 220 and the third image 230 each illustrate a different variation of a second programming pulse, e.g., "Pulse N+1." As one of ordinary skill in the art will appreciate, a program verify operation can be performed between programming pulses to determine whether a selected memory cell has reached a desired programmed state, e.g., whether the selected memory cell will be program inhibited during a subsequent programming pulse.

As illustrated, three memory cells 211-A, 211-B, and 211-C are having their charge storage nodes, e.g., floating gates "FG," programmed. Memory cells 211-A and 211-C are oppositely adjacent to the memory cell 211-B. The memory cells 211-A, 211-B, and 211-C are coupled to a word line 205. Each memory cell is associated with, e.g., coupled to, a bit line, e.g., bit lines 207-A, 207-B, and 207-C. Thus, bit lines 207-A and 207-C are oppositely adjacent to bit line 207-B. The layout of the bit lines 207-A, 207-B, and 207-C illustrated in FIG. 2 is intended to show an association between the memory cells 211-A, 211-B, and 211-C and the bit lines 207-A, 207-B, and 207-C respectively rather than a layout of the physical locations thereof. One of ordinary skill in the art will appreciate that bit lines may be formed in a number of locations with respect to the memory cells with which they are associated.

Memory cells 211-A, 211-B, and 211-C, coupled to word line 205, can be analogous to memory cells 111-1, 111-B, and 111-C, coupled to word line 105-1 in FIG. 1. Likewise bit lines 207-A, 207-B, and 207-C can be analogous to bit lines 107-1, 107-2, and 107-3 in FIG. 1. The images 210, 220, and 230 illustrate capacitive coupling between the floating gates of memory cell 211-B and the floating gates of adjacent memory cells 211-A and 211-C, represented by the capacitor symbol therebetween. The images 210, 220, and 230 also illustrate capacitive coupling between the floating gate of memory cell 211-B and channel regions underlying adjacent memory cells 211-A and 211-C, represented by the capacitor symbol therebetween. As memory devices are scaled to smaller sizes, capacitive coupling between adjacent components can increase because of the shorter distances between components.

Applying a program inhibit voltage to a bit line, e.g., bit line 207-A, can effectively turn off the drain select transistor, e.g., drain select transistor 119 illustrated in FIG. 1, and disconnect the NAND string, e.g., NAND string 109-1, from its associated bit line, e.g., bit line 107-1. This, in turn, floats the channels associated with the memory cells of the NAND string so that a respective channel, e.g., the channel associated with memory cell 211-A, can be boosted to a voltage roughly proportional to a voltage applied to a respective word line, e.g., word line 205, associated with a respective memory cell. Boosting the channel as such, e.g., to approximately the voltage applied to the word line, can effectively reduce a potential difference between the channel and the charge storage unit, e.g., the floating gate, which can inhibit programming of the memory cell, e.g., discourage electron transfer between the channel and the charge storage unit.

During a programming operation, e.g., an ABL programming operation, of a selected memory cell, e.g., memory cell 211-B, a program enable voltage, e.g., 0 V, can be applied to a bit line, e.g., bit line 207-B, associated with the selected memory cell. Thus, as illustrated in image 210, during an example programming pulse in which the three adjacent memory cells 211-A, 211-B, and 211-C are all receiving the programming pulse, all three adjacent bit lines 207-A, 207-B, and 207-C have the same voltage applied thereto, e.g., a program enable voltage "Pgm." Likewise, as the three memory cells 211-A, 211-B, and 211-C are coupled to the same word line 205, a control gate of each memory cell 211-A, 211-B, and 211-C can have the same voltage applied thereto. Accordingly, there may be little adverse effect on memory cell 211-B because the adjacent bit lines 207-A and 207-C and channel regions are at essentially the same voltage as those associated with memory cell 211-B.

The image 220 illustrates a programming pulse subsequent to Pulse N, e.g., Pulse N+1, in which one of the memory cells, e.g., memory cell 211-A, adjacent to memory cell 211-B is program inhibited. As a programming pulse for memory cells associated with word line 205 is applied to word line 205, one or more memory cells that have completed programming can be inhibited from further programming by applying an inhibit voltage to bit lines associated with those cells. For example, in image 220, an inhibit voltage is applied to bit line 207-A to inhibit memory cell 211-A from further programming while memory cells 211-B and 211-C receive additional charge from the programming Pulse N+1 applied to word line 205. An inhibit voltage applied to a bit line may generally be larger than a program enable voltage applied to a bit line.

Applying a program inhibit voltage to a bit line associated with a memory cell coupled to a selected word line, e.g., selected for programming, can effectively turn off a select transistor, e.g., applying a program inhibit voltage to bit line 107-1 can turn off drain select gate 119, as illustrated in FIG. 1. Turning off the select transistor can electrically disconnect a NAND string associated with the select transistor from the bit line, which can float a channel region underlying the memory cells of the NAND string. With respect to image 220, the program inhibit voltage applied to bit line 207-A can float the channel underlying memory cell 211-A, which can allow the channel to be boosted to the voltage applied to the word line 205 during the programming Pulse N+1. As such, the channel voltage associated with memory cell 211-A can be greater than the channel voltage associated with memory cell 211-B during programming Pulse N+1. As such, a single sided kink can affect the programming of the memory cell 211-B. That is, the effective voltage applied to memory cell 211-B is the voltage applied to the word line 205 plus some kink, e.g., increase, due at least in part to capacitive coupling between the memory cell 211-B and the channel underlying memory cell 211-A. Single sided kink can include capacitive coupling with one adjacent channel. For example, such a single sided kink can be approximately 150 mV, which can increase a programming voltage step size from 500 mV to 650 mV. Such an increase in programming voltage step size can cause the memory cell being programmed to receive more charge than is intended as a result of the programming pulse. Such over-programming can contribute to sensing errors such as read errors and/or program verify errors, e.g., by shifting the Vt of the memory cell to a higher level, e.g., to a higher programmed state.

The image 230 illustrates a programming pulse subsequent to Pulse N, e.g., Pulse N+1, in which both of the memory cells, e.g., memory cells 211-A and 211-C, adjacent to memory cell 211-B are being program inhibited. For example, in image 230, an inhibit voltage is applied to bit lines 207-A and 207-C to inhibit memory cells 211-A and 211-C from further programming while memory cell 211-B receives additional charge from the programming Pulse N+1 applied to word line 205. With respect to image 230, the program inhibit voltage applied to bit lines 207-A and 207-C can float the channels underlying memory cells 211-A and 211-C, which can allow the channels to be boosted to the voltage applied to the word line 205 during the programming Pulse N+1. The channel voltage associated with memory cells 211-A and 211-C can be greater than the channel voltage associated with memory cell 211-B during programming Pulse N+1. As such, a double sided kink can affect the programming of the memory cell 211-B. That is, the effective voltage applied to memory cell 211-B is the voltage applied to the word line 205 plus some kink due at least in part to capacitive coupling between the memory cell 211-B and the channels underlying memory cells 211-A and 211-C. Kink attributable to capacitive coupling with two adjacent channels is referred to as double sided kink. For example, such a double sided kink can be approximately 300 mV, which could increase a programming voltage step size from 500 mV to 800 mV. As with single sided kink, such an increase in programming voltage step size can contribute to operational errors for the memory cell being programmed. As the reader will appreciate, double sided kink can cause a programming voltage step increase larger than single sided kink, which can increase the likelihood of operational error.

Figure 3:
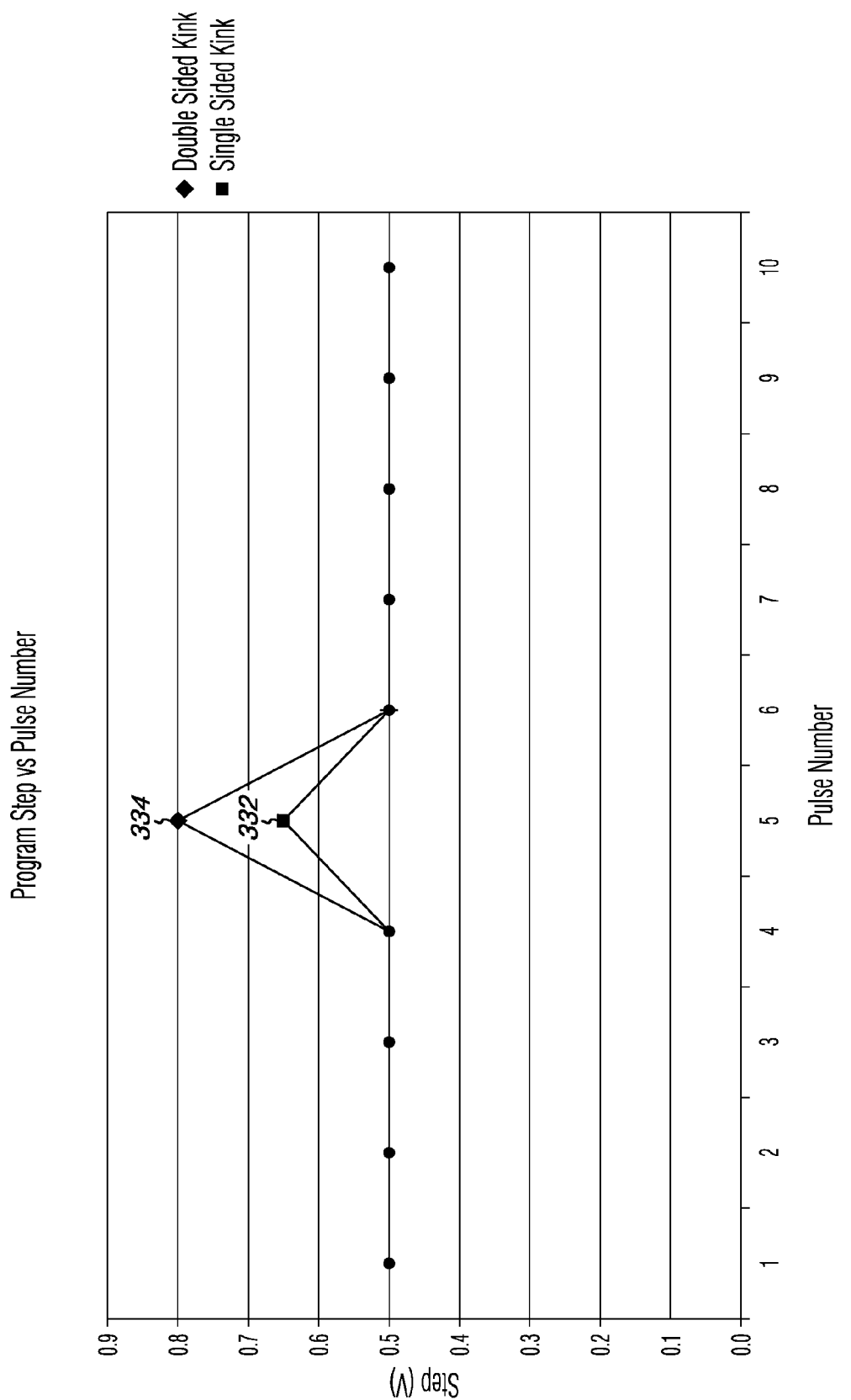
FIG. 3 is a prior art graph of program step voltage versus pulse number for a programming operation according to some previous approaches.

FIG. 3 is a prior art graph of program step voltage versus pulse number for a programming operation according to some previous approaches. The graph of FIG. 3 illustrates a series of programming pulses, e.g., pulses 1-10. With the exception of pulse 5, each pulse has a 500 mV step size. That is, each successive programming pulse is 500 mV larger than the previous pulse. For example, if pulse 1 is applied at 10V, then pulse two is applied at 10.5V, however embodiments are not limited to these example voltages. At 332, a particular memory cell undergoing programming, e.g., memory cell 211-B in image 220 of FIG. 2, experiences a single sided kink, which can effectively increase the programming pulse step size by about 150 mV from 500 mV to about 650 mV.

At 334, a particular memory cell undergoing programming, e.g., memory cell 211-B in image 230 of FIG. 2, experiences a double sided kink, which can effectively increase the programming pulse step size by about 300 mV from 500 mV to about 800 mV. As one of ordinary skill in the art will appreciate, the specific voltages given are examples, and different memory devices may operate with and/or experience different voltage levels. In contrast to the effects of programming kink associated with some previous approaches, e.g., as described with respect to FIGS. 2-3, one or more embodiments of the present disclosure can help reduce the effects of programming kink as described herein.

Figure 4A:
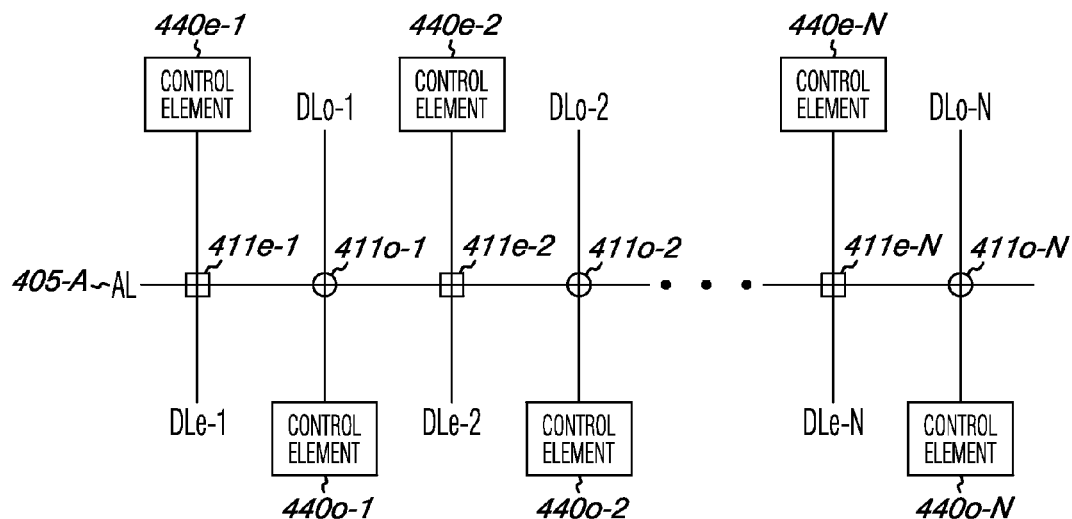
FIGS. 4A-4B are schematics of a portion of a memory array with a number of control elements according to one or more embodiments of the present disclosure.
Figure 4B:
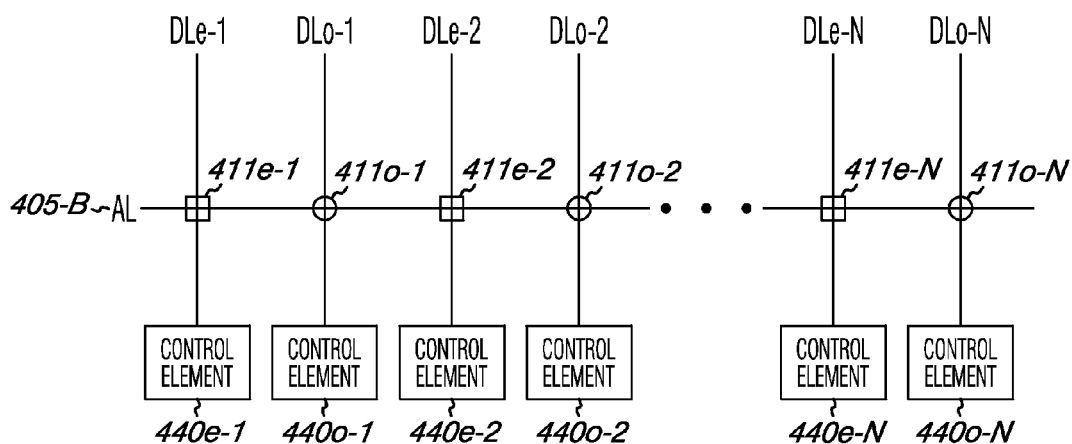

FIGS. 4A-4B are schematics of a portion of a memory array with a number of control elements according to one or more embodiments of the present disclosure. FIGS. 4A-4B include a number of memory cells 411e-1, 411o-1, 411e-2, 411o-2, . . . , 411e-N, 411o-N coupled to a word line, e.g., word line 405-A in FIG. 4A and word line 405-B in FIG. 4B. The memory cells 411e-1, 411o-1, 411e-2, 411o-2, . . . , 411e-N, 411o-N are selectively coupled, e.g., via their respective string and its drain select gate, to bit lines DLe-1, DLo-1, DLe-2, DLo-2, . . . , DLe-N, DLo-N. The bit lines are coupled to control elements 440e-1, 440o-1, 440e-2, 440o-2, . . . , 440e-N, 440o-N. Memory cells associated with "even numbered" bit lines are denoted as squares while memory cells associated with "odd numbered" bit lines are denoted as circles, although there is not necessarily a physical difference between the even and odd numbered memory cells or bit lines themselves. In other words, "even" and "odd" are only used herein as respective references.

The control elements 440e-1, 440o-1, 440e-2, 440o-2, . . . , 440e-N, 440o-N can include and/or be coupled to control circuitry for operating the bit lines DLe-1, DLo-1, DLe-2, DLo-2, . . . , DLe-N, DLo-N. Such control circuitry can include programming circuitry, sensing circuitry, and/or one or more cache elements to be used in association with the respective bit lines. For example, the control elements can include a dynamic data cache (DDC). The control elements 440e-1, 440o-1, 440e-2, 440o-2, . . . , 440e-N, 440o-N can include and/or be coupled to one or more features illustrated in FIG. 8, e.g., row decode circuitry 844, column decode circuitry 846, read/latch circuitry 850, write circuitry 855, address circuitry 840, I/O circuitry 860, and control circuitry 870.

FIG. 4A illustrates that control elements associated with bit lines can be coupled on opposite sides of a memory array for even and odd bit lines. FIG. 4A includes control elements 440e-1, 440e-2, . . . , 440e-N coupled to one end, e.g., the "top," of bit lines DLe-1, DLe-2, . . . , DLe-N with respect to the array of memory cells including memory cells 411e-1, 411o-1, 411e-2, 411o-2, . . . , 411e-N, 411o-N. Control elements 440o-1, 440o-2, . . . , 440o-N are coupled to the other end, e.g., the "bottom," of bit lines DLo-1, DLo-2, . . . , DLo-N respectively. Embodiments are not limited to even numbered control elements being on "top" and odd numbered control elements being on "bottom."

FIG. 4B includes the control elements 440e-1, 440o-1, 440e-2, 440o-2, . . . , 440e-N, 440o-N coupled to a common side of the bit lines DLe-1, DLo-1, DLe-2, DLo-2, DLe-N, DLo-N with respect to the array of memory cells including memory cells 411e-1, 411o-1, 411e-2, 411o-2, . . . , 411e-N, 411o-N. Although the control elements are illustrated as being coupled to the "bottom" of the bit lines with respect to the memory array, embodiments are not so limited. The control elements could likewise all be coupled to the "top" of the bit lines with respect to the memory array. Furthermore, with respect to FIGS. 4A-4B, there is no significant difference between the "top" and "bottom" of the bit lines with respect to the memory array. Rather, the terms "top" and "bottom" are used to provide points of reference.

According to one or more embodiments of the present disclosure, the control elements 440e-1, 440o-1, 440e-2, 440o-2, . . . , 440e-N, 440o-N can be configured to perform a kink check before a programming pulse. A kink check can be an operation that includes determining whether one or more memory cells adjacent to a particular memory cell, and coupled to a common word line, will be program inhibited during a subsequent programming pulse, e.g., whether the one or more adjacent memory cells have completed programming. For example, a kink check can be performed for memory cell 411-o1 by first determining whether memory cells 411-e1 and 411-e2 will be program inhibited during a subsequent programming pulse. As described herein, such programming status information can be stored in a cache element associated with a particular memory cell. A particular memory cell, e.g., memory cell 411-e1, coupled to a bit line, e.g., bit line DLe-1, can be program inhibited for a programming pulse when the particular memory cell has completed programming to help prevent the programming pulse applied to a word line, e.g., word line 405-A, coupled to the particular memory cell from putting additional charge on a floating gate of the particular memory cell. A control element, e.g., control element 440e-1, can program inhibit a memory cell, e.g., memory cell 411e-1, by applying a program inhibit voltage to a bit line, e.g., bit line DLe-1, associated with the memory cell.

During a kink checking operation, a NAND string, and the memory cells associated therewith, can be disconnected from their associated bit line by turning off a select gate corresponding to the bit line. For example with reference to FIG. 1, NAND string 109-1 can be disconnected from bit line 107-1 by turning off drain select gate 119. As described herein, programming status information for a particular memory cell can be stored in a particular cache element associated with the particular memory cell. Because information is not needed directly from the particular memory cell during the kink checking operation, the string and associated memory cells can be disconnected from the bit line so as not to interfere with a sensing operation associated with the kink checking operation. As such, a bit line voltage sensed during a kink checking operation reacts to the voltages applied to the bit lines as part of the kink checking operation, and not to a programmed state of one or more memory cells.

In one or more embodiments a kink check can be performed for all memory cells associated with a word line selected for programming. Such a kink check can include performing a first kink check and a second kink check before a programming pulse. The first kink check can include kink checking the odd numbered bit lines DLo-1, DLo-2, . . . , DLo-N by floating odd numbered bit lines DLo-1, DLo-2, . . . , DLo-N and selectively applying one of two voltages to each of the even numbered bit lines DLe-1, DLe-2, . . . , DLe-N according to, e.g., dependent upon, a programming status of a memory cell 411e coupled to the respective even numbered bit lines DLe and to the access line 405.

If the respective memory cell's programming status is programming incomplete, e.g., if the respective memory cell has not completed programming, then a first voltage can be applied, e.g., zero volts, and if the respective memory cell's programming status is programming complete, e.g., if the respective memory cell has completed programming, then a second voltage can be applied, e.g., 1V. As described herein, a programming status for a particular memory cell can be stored in a cache element associated with the particular memory cell and updated according to a result of one or more program verify operations performed on the selected memory cell, e.g., in association with one or more programming pulses applied to a word line associated with the particular memory cell. Embodiments are not limited to applying 0V as the first voltage or 1V as the second voltage, as these values are given to illustrate an example. While such voltages are applied to the even numbered bit lines, each of the odd numbered bit lines can be sensed to determine an effect thereon due at least in part to the voltage(s) applied to the respective adjacent even numbered bit lines. That is, while a particular odd numbered bit line, e.g., bit line DLo-1 is floated, the first and/or the second voltages applied to the adjacent even numbered data lines, e.g., data lines DLe-1 and DLe-2, can cause a voltage increase on the particular odd numbered bit line through capacitive coupling therewith. For example, if 0V is applied to both bit lines DLe-1 and DLe-2 adjacent to bit line DLo-1, e.g., when neither adjacent memory cell has completed programming, then capacitive coupling between bit line DLo-1 and bit lines DLe-1 and DLe-2 can yield a 0V increase, e.g., zero kink.

If 0V is applied to one of bit lines DLe-1 and DLe-2 adjacent to bit line DLo-1 and 1V is applied to the other of bit lines DLe-1 and DLe-2, e.g., when one adjacent memory cell has completed programming, then the voltage on bit line DLo-1 can increase by approximately 0.5V due at least in part to capacitive coupling with bit lines DLe-1 and DLe-2. If 1V is applied to both bit lines DLe-1 and DLe-2, e.g., when both adjacent memory cells have completed programming, then the voltage on bit line DLo-1 may increase by approximately 1V due at least in part to capacitive coupling with bit lines DLe-1 and DLe-2. Thus, by sensing bit line DLo-1, a determination can be made as to whether a double sided kink, a single sided kink, or no kink will occur during a subsequent programming pulse applied to the access line 405.

Some previous approaches to addressing programming kink, e.g., to addressing issues related to differing effects of a program pulse on a particular memory cell because of a programming status of one or more adjacent memory cells along a common word line, may have relied on sensing each adjacent bit line and making adjustments according to sensing the adjacent bit lines. Such previous approaches may include a tangible physical connection, e.g., drawn lines, between control elements, which can be impractical for instances where control elements are on opposite sides of the memory array, e.g., as illustrated in FIG. 4A. However, even when control elements are on a same side of the memory array, e.g., as illustrated in FIG. 4B, such implementations can be difficult to implement and costly in terms of manufacturability and materials. In contrast, one or more embodiments of the present disclosure use capacitive coupling between two or more adjacent bit lines and/or strings and/or memory cells to provide information such that sensing a particular bit line provides sufficient information about adjacent bit lines to make a determination as to whether double sided kink, single sided kink, or no kink will be present on a subsequent programming pulse applied to a memory cell coupled to the particular bit line.

The second kink check can include kink checking the even numbered bit lines DLe-1, DLe-2, DLe-N with an operation similar to the first kink check, but having the even and odd numbered bit lines operated oppositely as in the first kink check. That is, the even numbered bit lines DLe-1, DLe-2, DLe-N can be floated while one of two voltages is selectively applied to each of the odd numbered bit lines DLo-1, DLo-2, . . . , DLo-N according to a programming status of a memory cell 411o coupled to the respective odd numbered bit line and to the access line 405. While such voltages are applied to the odd numbered bit lines, each of the even numbered bit lines can be sensed to determine an effect thereon due at least in part to the voltage(s) applied to the respective adjacent odd numbered bit lines. According to one or more embodiments of the present disclosure, either the odd or the even numbered bit lines can be checked first. That is, embodiments are not limited to checking the odd numbered bit lines first as described above.

Once a determination has been made as to whether there will be a double sided kink, single sided kink, or no kink affecting programming of a particular memory cell, a kink correction can be applied to the particular bit line associated with that particular memory cell during a subsequent programming pulse. For example, during a subsequent programming operation, a kink correction voltage can be applied to the particular bit line, e.g., in addition to the program enable voltage applied to the particular bit line, according to the number of memory cells adjacent to the particular memory cell that will be program inhibited, e.g., according to the number of adjacent memory cells that have completed programming. The magnitude of the kink correction voltage can be proportional to the voltage sensed on the bit line during the kink check. For example, if 0V is sensed during the kink check, then 0V can be applied as a kink correction voltage; if 0.5V is sensed during the kink check, then 150 mV can be applied as a kink correction; if 1.0V is sensed during the kink check, then 300 mV can be applied as a kink correction. Embodiments are not limited to these example voltages.

Applying a kink correction to the bit line can include applying a voltage greater than a voltage that would otherwise be applied to the bit line during programming of a memory cell coupled to the bit line, but less than a program inhibit voltage. For example, if 0V would otherwise be applied to a particular bit line during programming and Vcc, e.g., 2V, would be applied to program inhibit a memory cell coupled to the bit line, a single sided kink correction can include applying 300 mV and a double sided kink correction can include applying 600 mV to the particular bit line. Embodiments are not limited to the specific voltages used in these examples.

Kink correction voltages can be sufficient to reduce the kink effects of capacitive coupling between a particular memory cell and one or more adjacent memory cells such that a programming pulse has its intended effect on the particular memory cell, e.g., a 15.0V programming pulse applied to the word line is received by the memory cell as 15.0V rather than as 15.3V due at least in part to capacitive coupling with one or more adjacent memory cells. That is, kink correction voltages, e.g., an increased bit line voltage, can reduce the effect of a programming pulse applied to the word line for a memory cell associated with the bit line and the word line, e.g., an increased voltage on DLo-1 can decrease the effect of a programming pulse on word line 405-A for memory cell 411o-1 by reducing the potential difference between the word line, e.g., from a programming pulse applied thereto, and the channel underlying the floating gate. As described herein, increasing the bit line voltage for a particular memory cell can cause a corresponding increase in the channel voltage for the memory cell. Kink correction voltages are not of sufficient magnitude to place the bit line, and memory cells coupled thereto, into a program inhibit mode such that a programming pulse applied to the memory cell does not alter the state of the memory cell, e.g., an amount of charge on a floating gate of the memory cell. In one or more embodiments, a number of operations can be performed on a memory device in the order of: programming pulse, program verify operation, and kink check, possibly followed by a subsequent programming pulse with kink correction.

FIG. 5A is a timing diagram associated with a first kink checking operation according to one or more embodiments of the present disclosure. Image 550 illustrates three example bit line voltages 0V, 0.5V and 1V associated with an example embodiment for a kink check as described herein. The particular voltages 0V, 0.5V, and 1V are examples and one or more embodiments described herein can use different voltages.

As described herein, a kink check can include sensing a particular bit line to determine an effect thereon due at least in part to capacitive coupling between the particular bit line and adjacent bit lines that have one of two voltages, e.g., 0V or 1V, applied according to a programming status of the memory cells associated therewith. The particular bit line voltage due at least in part to capacitive coupling for these example voltages, can therefore be approximately 0V, e.g., for no kink, 0.5V, e.g., for single sided kink, or 1V, e.g., for double sided kink. As illustrated in image 550, a first sense voltage 551, e.g., 0.25V, can be used to determine whether the bit line is at 0V or either 0.5V or 1.0V, and a second sense voltage 552, e.g., 0.75V, can be used to determine whether the bit line is at 0.5V or 1.0V. Embodiments are not limited to these example voltages or to this particular sensing scheme. For example, other sensing schemes can be used such as may employ a voltage ramp for sensing, as will be appreciated by one of ordinary skill in the art.

The timing diagram associated with FIG. 5A includes a signal tdc 553-A, which corresponds to the temporary data cache (tdc) node 553-A illustrated in the schematic of FIG. 5C, e.g., the line between switch 559-2 and switch 559-3. The timing diagram also includes a signal DLCLAMP 554-A, which corresponds to the DLCLAMP 554-C line illustrated in the schematic of FIG. 5C. An appropriate DLCLAMP signal 554-C can couple the bit line 507 to the tdc node 553-C by operation of the switch 559-2. While the term "switch" is sued herein, the switching device may be a transistor (as shown) or another type of switching device. In FIG. 5A, the tdc signal 553-A increases to Vcc. With respect to FIG. 5C, such an increase on tdc node 553-C can occur when precharging circuitry, e.g., Vcc, 556-1 is coupled to tdc node 553-C via operation of switch 559-1. Connecting Vcc 556-1 to tdc node 553-C can charge the capacitance, e.g., a discrete capacitor and/or parasitic capacitance, 557-1 to Vcc when switches 559-2 and 559-3 are off and switch 559-4 is on.

Once the capacitance 557-1 has been charged to Vcc, a sense voltage 551 can be applied to DLCLAMP line 554-C, as illustrated by DLCLAMP signal 554-A. In one or more embodiments, the sense voltage applied to DLCLAMP line 554-C can be a desired sense voltage plus a threshold voltage associated with the switch 559-1, e.g., a voltage sufficient to fully turn on the transistor, although embodiments are not so limited. With respect to the example voltages used in association with FIGS. 5A-5C, the bit line 507 can have one of three voltages thereon, e.g., 0V, 0.5V, or 1V. Thus, for the application of sensing voltage 551 to DLCLAMP line 554-C, switch 559-2 will turn on when the bit line 507 is lower than the sense voltage, e.g., 0V, but not when the bit line 507 is higher than the sense voltage, e.g., 0.5V or 1V. As illustrated in FIG. 5A, the tdc signal 553-A drops to the voltage on the bit line, e.g., as represented by the dotted line, when the voltage on the bit line is 0. That is, with respect to FIG. 5C, switch 559-2 turns on allowing the capacitance 557-1, which was previously charged to Vcc, to drain out through the data line so that tdc node 553-C drains toward the bit line voltage, e.g., 0V. Switch 559-3 can be turned on to latch 558 this information, e.g., to record the fact that the bit line 507 is at 0V.

Conversely, when the bit line 507 is at 0.5V for application of the sense voltage 551 to DLCLAMP line 554-C, the switch 559-2 will not turn on, which leaves the voltage on tdc node 553-C at Vcc, e.g., the voltage to which capacitance 557-1 is charged, as illustrated by the solid line on tdc signal 553-A remaining at Vcc after DLCLAMP 554-A rises to the sensing voltage+Vtn. When the switch 559-3 is turned on, the latch 558 can record the fact that the bit line 507 is at a voltage greater than sense voltage 551. Subsequently, sense voltage 552 can be applied to determine whether the bit line 507 is at 0.5V or 1V.

The latch 558 can have a particular trip point, e.g., approximately 1V, although embodiments are not so limited. Vcc can be some value greater than the trip point of the latch 558, e.g., 2V. Thus, for the sensing operation associated with the sensing voltage 551, the latch will trip when tdc node 553-C remains at Vcc, e.g., when the bit line is at 0.5V or 1V. Likewise, the latch will not trip when the voltage on tdc node 553-C drains toward the bit line voltage of 0V.

FIG. 5B is a timing diagram associated with a second kink checking operation according to one or more embodiments of the present disclosure. FIG. 5B relates to the application of sensing voltage 552 to DLCLAMP line 554-C to distinguish between 0.5V and 1V on the bit line 507. FIG. 5B includes a signal 553-B representing the voltage on tdc node 553-C, a DCLAMP signal 554-B, and a boost voltage signal 555, e.g., Vcc/2.

The capacitance 557-1 associated with tdc node 553-C can be charged to Vcc with respect to ground as described in connection with FIG. 5A, and as illustrated by the tdc signal 553-B. Subsequently a boost voltage signal 555 can be used to boost the voltage of tdc signal 553-B with respect to ground. In the embodiment illustrated in FIGS. 5B and 5C, the boost voltage is Vcc/2, however embodiments are not limited to this specific example boost voltage. With respect to FIG. 5C, the boost voltage can be applied to tdc node 553-C by charging the capacitance 557-2 to Vcc/2. Capacitance 557-2 can be coupled to boosting circuitry, e.g., Vcc/2, 556-2 across the capacitance 557-2 to ground by turning on switch 559-5. Subsequently, switch 559-4 can be turned off while switch 559-6 is turned on such that capacitances 557-1 and 557-2 are coupled in series to tdc node 553-C, yielding a potential of Vcc+Vcc/2 above ground.

After tdc 553-B is at Vcc+Vcc/2, the sense voltage 552 can be applied to DLCLAMP line 554-B. As described above with respect to FIG. 5A, the sense voltage 552 can be applied as the sense voltage plus a threshold voltage of the transistor 559-2 associated with DLCLAMP line 554-C, although embodiments are not so limited. If the bit line 507 is at 1V, the switch 559-2 will not turn on by application of the sense voltage 552, e.g., 0.75V, to DLCLAMP line 554-C. Thus, tdc node 553-C remains at Vcc+Vcc/2. Accordingly, when the latch 558 is coupled to the tdc node 553-C by turning on switch 559-3, it will read Vcc+Vcc/2 as indicated by the solid line on tdc 553-B, e.g., 3V, which can be sufficient to trip the latch, indicating that the bit line 507 is above the sense voltage, e.g., 1V. Conversely, if the bit line 507 is at 0.5V, application of the sensing voltage 552 to DLCLAMP line 554-C will turn on the switch 559-2 to couple the bit line 507 to the tdc node 553-C. The tdc node 553-C can begin to drain to the bit line 507 voltage as indicated by the dotted line on tdc signal 553-B.

As described herein, the latch 558 can have a particular trip point, e.g., approximately 1V. In some instances, 0.5V on the bit line 507 may be sufficiently close to the latch trip point, particularly when process corners, such as operating temperature, which can affect operating voltages of the device are considered, to cause erroneous operation of the latch 558. Accordingly, after draining tdc as described above, the boost voltage can be removed by switching, as indicated by boost signal 555 going low after application of the sensing voltage 552 to DLCLAMP line 554-C. Removing the boost voltage can shift the voltage on tdc node 553-C lower than the bit line 507 voltage to help prevent erroneous operation of the latch 558. For example, the tdc node 553-C voltage, e.g., Vcc+Vcc/2, can drain to the bit line 507 voltage, e.g., 0.5V, such that the capacitances 557-1 and 557-2 will discharge to a cumulative voltage of 0.5V, equivalent to the bit line 507. Before the switch 559-3 is turned on to latch the tdc node 553-C voltage to latch 558, switch 559-6 can be turned off and switch 559-4 can be turned on to uncouple capacitance 557-2 between the tdc node 553-C and ground. Such operation will effectively reduce the tdc node 553-C voltage by the portion of the tdc node 553-C voltage stored on the capacitance 557-2. Thus, as illustrated by the dotted line on tdc 553-B, the tdc voltage will drop from the bit line voltage, e.g., 0.5V to some lesser voltage. Such an operation can reduce the voltage sensed by the latch 558 to help prevent erroneous operation thereof.

FIG. 5C is a schematic of sensing circuitry according to one or more embodiments of the present disclosure. The sensing circuitry associated with FIG. 5C can be included with and/or coupled to one or more control elements, e.g., control elements 440*e*-1, 440*o*-1, 440*e*-2, 440*o*-2, . . . , 440*e*-N, 440*o*-N illustrated in FIGS. 4A and 4B. FIG. 5C is one example of a sensing circuit that can be used with the present disclosure. Switches that can be used to alter one or more electrical paths of the sensing circuit, e.g., between configurations applicable for sensing operations using the first sense voltage 551 or the second sense voltage 552, e.g., switches 559-4, 559-5, and 559-6 can be reconfigured to provide a number of alternate implementations. Likewise, embodiments are not limited to the use of metal oxide semiconductor field effect transistors (MOSFET) as switching elements for the sensing circuitry illustrated in FIG. 5C. As described with respect to FIGS. 5A-5C, the sensing circuit and operation can effectively determine the voltage on a selected bit line 507 due at least in part to capacitive coupling with one or more adjacent bit lines in order to perform a kink check, as described herein.

Figure 6:
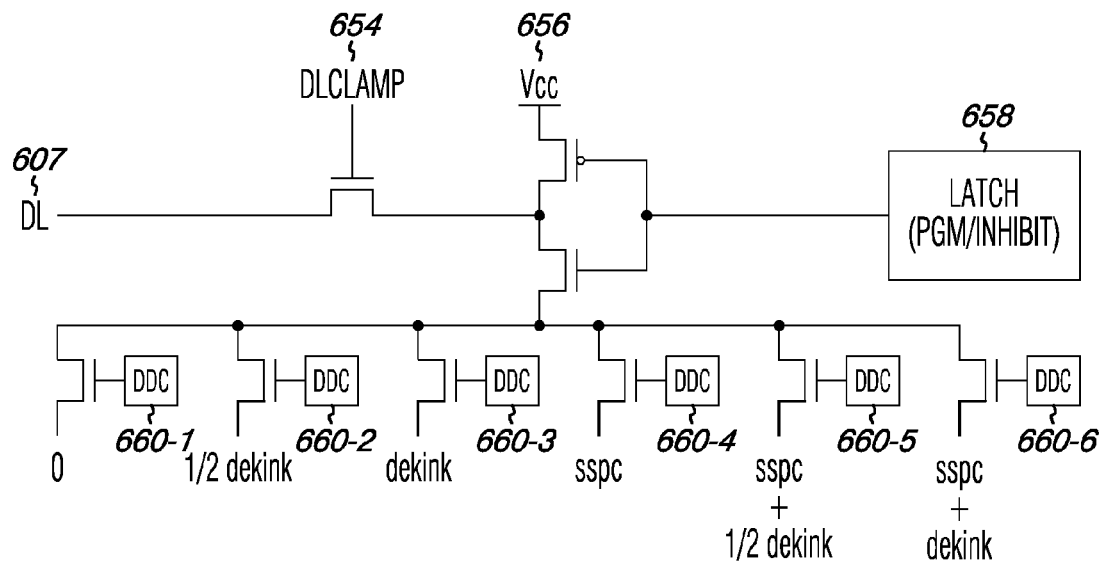
FIG. 6 is a schematic of programming circuitry according to one or more embodiments of the present disclosure.

FIG. 6 is a schematic of programming circuitry according to one or more embodiments of the present disclosure. The programming circuitry associated with FIG. 6 can be included with and/or coupled to one or more control elements, e.g., control elements 440*e*-1, 440*o*-1, 440*e*-2, 440*o*-2, . . . , 440*e*-N, 440*o*-N illustrated in FIGS. 4A and 4B. In one or more embodiments, programming circuitry can be selectively coupled to a data line "DL" 607, e.g., a bit line, responsive to DLCLAMP line 654 and include a supply voltage 656 and a program/inhibit latch 658. Program/inhibit latch 658 can be analogous to program inhibit latch 558 illustrated in FIG. 5C. DLCLAMP line 654 can be included as a component of the programming circuitry or be a separate element therefrom. DLCLAMP line 654 can be analogous to DLCLAMP line 554-C illustrated in FIG. 5C. For example, a same DLCLAMP signal can be used to selectively couple a bit line to programming circuitry and sensing circuitry. In such embodiments, additional switching devices can be included to selectively couple the bit line to sensing or programming circuitry. In one or more embodiments, DLCLAMP line 654 can be different from DLCLAMP line 554-C. In one or more embodiments, sensing circuitry, e.g., the sensing circuitry illustrated in FIG. 5C, and programming circuitry, e.g., programming circuitry illustrated in FIGS. 6 and 7, can be included with and/or coupled to a common control element, e.g., a control element 440 illustrated in FIGS. 4A and 4B.

The programming circuitry can include a number of storage elements, e.g., DDCs 660-1, 660-2, 660-3, 660-4, 660-5, and 660-6. The DDCs can be utilized to apply a particular kink correction voltage to the bit line 607. In the example embodiment of FIG. 6, DDC 660-1 can be used to apply 0V to the bit line 607; DDC 660-2 can be used to apply a single sided kink correction, e.g., dekink, voltage, e.g., ½ dekink, to the bit line 607; DDC 660-3 can be used to apply a double sided dekink, e.g., dekink, voltage to the bit line 607; DDC 660-4 can be used to apply a selective slow programming convergence (SSPC) voltage to the bit line 607; DDC 660-5 can be used to apply an SSPC+½ dekink voltage to the bit line 607; and DDC 660-6 can be used to apply an SSPC+dekink voltage to the bit line 607. With respect to FIG. 6, the power supply, e.g., Vcc 656, may be referred to as a seventh storage element for applying Vcc to the bit line 607. A ½ dekink voltage can be a voltage applied to the bit line 607 to correct a single side programming kink, e.g., an instance in which one adjacent bit line is program inhibited during a programming operation. A (full) dekink voltage can be a voltage applied to the bit line 607 to correct a double sided programming kink, e.g., an instance in which two adjacent bit lines are program inhibited during a programming operation.

Selective slow programming convergence (SSPC) is a technique sometimes used with NAND memory to generate a very narrow threshold voltage (Vth) distribution without reducing programming throughput. Applying an SSPC voltage to a bit line associated with a memory cell selected to receive a programming pulse can reduce the effect of the programming pulse applied to a word line associated with the selected memory cell. The SSPC voltage can reduce the channel associated with the selected memory cell to an intermediate voltage between a program inhibit voltage and what would otherwise be a programming voltage applied to the bit line. Thus, the SSPC voltage "slows" the programming of the selected memory cell. One or more kink correction programming operations of the present disclosure can be used in conjunction with SSPC programming operations to both narrow the Vth of a selected memory cell and to reduce the effect of programming kink associated with some previous approaches. For example, if an SSPC voltage is 100 mV and a ½ dekink voltage is 150 mV, then an SSPC+½ dekink voltage can be 250 mV. Embodiments are not limited to these example voltages.

The storage elements 660-1, 660-2, 660-3, 660-4, 660-5, and 660-6, e.g., DDCs, illustrated in FIG. 6 may be referred to as decoded storage elements. That is, each storage element can be associated with one particular operating voltage. However, one or more embodiments of the present disclosure can utilize encoded storage elements in lieu of decoded storage elements. For example, FIG. 6 includes seven decoded storage elements, e.g., DDCs 660-1, 660-2, 660-3, 660-4, 660-5, and 660-6 and Vcc 656. However, FIG. 6 could alternatively include three encoded storage elements to replace the seven decoded storage elements. Each of the three encoded storage elements can be analogized to one bit of a three digit binary number. The combination of the three encoded storage elements can provide up to nine different combinations, which is sufficient to provide for selection of one of the seven operating voltages associated with FIG. 6 as illustrated.

Figure 7:
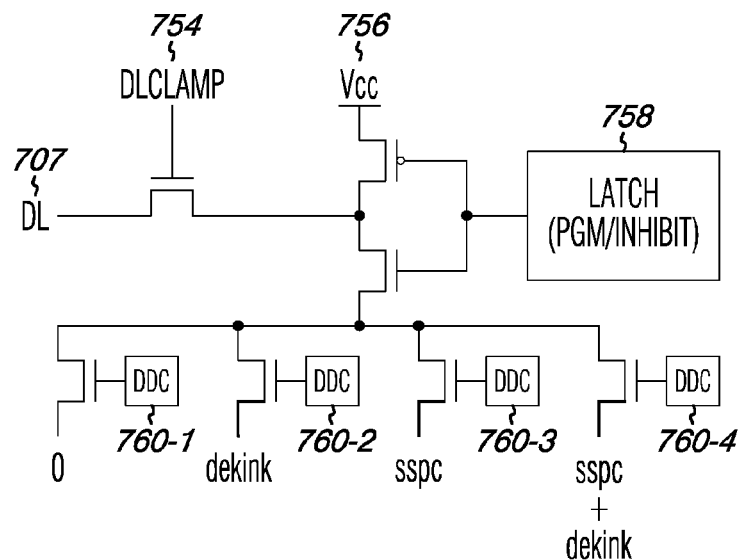
FIG. 7 is a schematic of programming circuitry according to one or more embodiments of the present disclosure.

FIG. 7 is a schematic of programming circuitry according to one or more embodiments of the present disclosure. The programming circuitry associated with FIG. 7 can be included with and/or coupled to one or more control elements, e.g., control elements 440e-1, 440o-1, 440e-2, 440o-2, ..., 440e-N, 440o-N illustrated in FIGS. 4A and 4B. In one or more embodiments, programming circuitry can be selectively coupled to a bit line 707 responsive to DLCLAMP line 754 and include a supply voltage 756 and a program/inhibit latch 758. DLCLAMP line 754 can be analogous to DLCLAMP line 654 illustrated in FIG. 6. Program/inhibit latch 758 can be analogous to program/inhibit latch 658 illustrated in FIG. 6. The programming circuitry can include a number of storage elements, e.g., DDCs 760-1, 760-2, 760-3, and 760-4. The DDCs can be utilized to apply a particular voltage to the data line "DL" 707, e.g., bit line. In the example embodiment of FIG. 7, DDC 760-1 can be used to apply 0V to the bit line 707; DDC 760-2 can be used to apply a kink correction, e.g., dekink, voltage; DDC 760-3 can be used to apply an SSPC voltage to the bit line 707; and DDC 760-4 can be used to apply an SSPC+dekink voltage to the bit line 707. With respect to FIG. 7, the power supply, e.g., Vcc 756, may be referred to as a fifth storage element for applying Vcc to the bit line 707.

As the reader will appreciate, the embodiment illustrated in FIG. 7 is similar to that of FIG. 6, with the omission of the ½ dekink voltage, e.g., DDC 660-2, and the SSPC+½ dekink voltage, e.g., DDC 660-5. In one or more embodiments, and in the embodiment illustrated in FIG. 7, both single and double sided programming kinks can be corrected with application of one dekink voltage. That is, if any programming kink is detected, a singular dekink voltage can be applied during a programming pulse. Such embodiments can reduce the amount of space consumed on a memory device for sensing circuitry to check for a programming kink and/or programming circuitry to correct for a programming kink.

With respect to FIGS. 5A-5C, the sensing circuitry can be reduced by treating both single and double sided programming kink similarly. For example, one or more embodiments of the present disclosure that treat single and double sided programming kinks equally would only distinguish between no kink and some kink, e.g., 0V and (0.5V or 1V), according to the example of image 550 in FIG. 5A. For example, the sensing circuitry used to distinguish between 0V and (0.5V or 1V) might not be included, or the sensing circuitry used to distinguish between 0.5V and 1V might not be included with such embodiments. As such, these embodiments can also reduce a sensing time associated with checking programming kinks.

Figure 8:
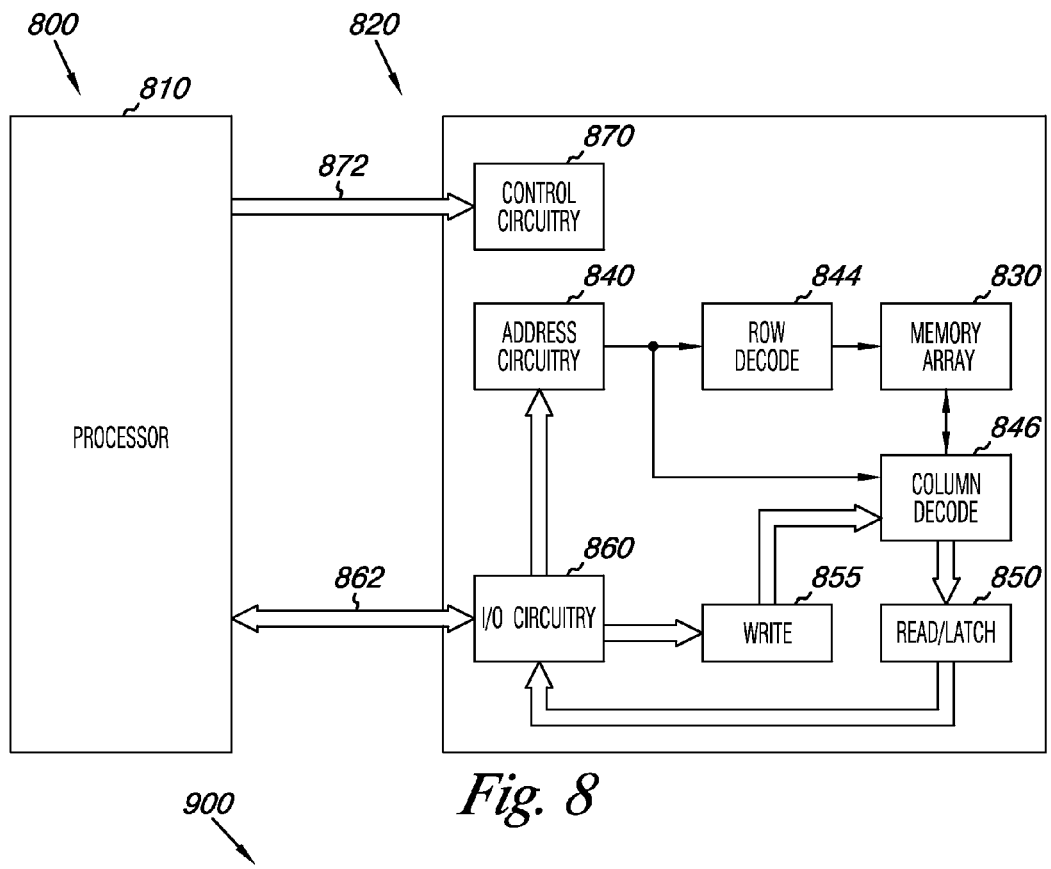
FIG. 8 is a functional block diagram of an electronic memory system having at least one memory device operated in accordance with one or more embodiments of the present disclosure.

FIG. 8 is a functional block diagram of an electronic memory system 800 having at least one memory device 820 operated in accordance with one or more embodiments of the present disclosure. Memory system 800 includes a processor 810 coupled to a non-volatile memory device 820 that includes a memory array 830 of non-volatile cells, e.g., memory array 100 of non-volatile cells 111-1, ..., 111-N shown in FIG. 1. The memory system 800 can include separate integrated circuits or both the processor 810 and the memory device 820 can be on the same integrated circuit. The processor 810 can be a microprocessor or some other type of controlling circuitry such as an application-specific integrated circuit (ASIC).

The memory device 820 includes an array of non-volatile memory cells 830, which can be floating gate flash memory cells with a NAND architecture, as previously described herein. The embodiment of FIG. 8 includes address circuitry 840 to latch address signals provided over I/O connections 862 through I/O circuitry 860. Address signals are received and decoded by a row decoder 844 and a column decoder 846 to access the memory array 830. In light of the present disclosure, it will be appreciated by those skilled in the art that the number of address input connections depends on the density and architecture of the memory array 830 and that the number of addresses increases with both increased numbers of memory cells and increased numbers of memory blocks and arrays.

The memory device 820 senses data in the memory array 830 by sensing voltage and/or current changes in the memory array columns using sense/buffer circuitry that in this embodiment can be read/latch circuitry 850. The read/latch circuitry 850 can read and latch a page, e.g., a row, of data from the memory array 830. I/O circuitry 860 is included for bi-directional data communication over the I/O connections 862 with the processor 810. Write circuitry 855 is included to write data to the memory array 830.

Control circuitry 870 decodes signals provided by control connections 872 from the processor 810. These signals can include chip signals, write enable signals, and address latch signals that are used to control the operations on the memory array 830, including data sensing, data write, and data erase operations, as described herein. In one or more embodiments, the control circuitry 870 is responsible for executing instructions from the processor 810 to perform the operations according to embodiments of the present disclosure. The control circuitry 870 can be a state machine, a sequencer, or some other type of controller. It will be appreciated by those skilled in the art that additional circuitry and control signals can be provided, and that the memory device detail of FIG. 8 has been reduced to facilitate ease of illustration.

Figure 9:
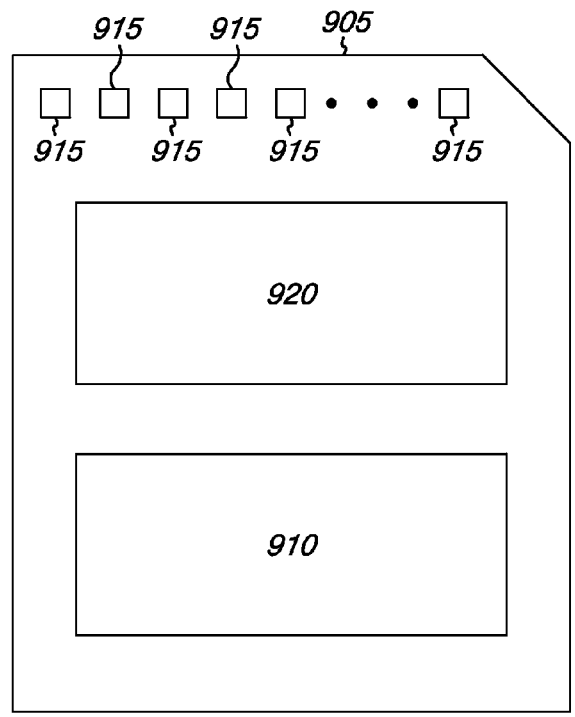
FIG. 9 is a functional block diagram of a memory module having at least one memory device operated in accordance with one or more embodiments of the present disclosure.

FIG. 9 is a functional block diagram of a memory module 900 having at least one memory device operated in accordance with one or more embodiments of the present disclosure. Memory module 900 is illustrated as a memory card, although the concepts discussed with reference to memory module 900 are applicable to other types of removable or portable memory (e.g., USB flash drives and/or solid-state drives) and are intended to be within the scope of "memory module" as used herein. In addition, although one example form factor is depicted in FIG. 9, these concepts are applicable to other form factors as well.

In one or more embodiments, memory module 900 will include a housing 905 (as depicted) to enclose one or more memory devices 910, though such a housing is not essential to all devices or device applications. At least one memory device 910 includes an array of non-volatile multilevel memory cells, e.g., array 100 of non-volatile memory cells 111-1, . . . , 111-N shown in FIG. 1. Where present, the housing 905 includes one or more contacts 915 for communication with a host device. Examples of host devices include digital cameras, digital recording and playback devices, PDAs, personal computers, memory card readers, interface hubs and the like. For one or more embodiments, the contacts 915 are in the form of a standardized interface. For example, with a USB flash drive, the contacts 915 might be in the form of a USB Type-A male connector. For one or more embodiments, the contacts 915 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 915 provide an interface for passing control, address and/or data signals between the memory module 900 and a host having compatible receptors for the contacts 915.

The memory module 900 may optionally include additional circuitry 920, which may be one or more integrated circuits and/or discrete components. For one or more embodiments, the additional circuitry 920 may include control circuitry, such as a memory controller, for controlling access across multiple memory devices 910 and/or for providing a translation layer between an external host and a memory device 910. For example, there may not be a one-to-one correspondence between the number of contacts 915 and a number of connections to the one or more memory devices 910. Thus, a memory controller could selectively couple an I/O connection (not shown in FIG. 9) of a memory device 910 to receive the appropriate signal at the appropriate I/O connection at the appropriate time or to provide the appropriate signal at the appropriate contact 915 at the appropriate time. Similarly, the communication protocol between a host and the memory module 900 may be different than what is used for access of a memory device 910. A memory controller could then translate the command sequences received from a host into the appropriate command sequences to achieve the desired access to the memory device 910. Such translation may further include changes in signal voltage levels in addition to command sequences.

The additional circuitry 920 may further include functionality unrelated to control of a memory device 910 such as logic functions as might be performed by an ASIC. Also, the additional circuitry 920 may include circuitry to restrict read or write access to the memory module 900, such as password protection, biometrics or the like. The additional circuitry 920 may include circuitry to indicate a status of the memory module 900. For example, the additional circuitry 920 may include functionality to determine whether power is being supplied to the memory module 900 and whether the memory module 900 is currently being accessed, and to display an indication of its status, such as a solid light while powered and a flashing light while being accessed. The additional circuitry 920 may further include passive devices, such as decoupling capacitors to help regulate power requirements within the memory module 900.

CONCLUSION

The present disclosure includes methods, devices, modules, and systems for operating semiconductor memory. One method embodiment includes selectively applying one of a plurality of, e.g., two, voltages to a first data line according to a programming status of a first memory cell (where the first memory cell is coupled to the first data line and to a selected access line). An effect on a second data line is determined due at least in part to the voltage applied to the first data line and capacitive coupling between at least the first data line and the second data line (where a second memory cell is coupled to the second data line, and the second memory cell is adjacent to the first memory cell and is coupled to the selected access line). A kink correction is applied to the second data line, responsive to the determined effect, during a subsequent programming pulse applied to the second memory cell.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of one or more of the associated listed items.

As used herein, the term "and/or" includes any and all combinations of one or more of the associated listed items. As used herein the term "or," unless otherwise noted, means logically inclusive or. That is, "A or B" can include (only A), (only B), or (both A and B). In other words, "A or B" can mean "A and/or B" or "one or more of A and B."

It will be understood that, although the terms first, second, etc. may be used herein to describe various elements and that these elements should not be limited by these terms. These terms are only used to distinguish one element from another element. Thus, a first element could be termed a second element without departing from the teachings of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating a memory device, comprising:
   selectively applying one of a plurality of voltages to a first data line according to a programming status of a first memory cell, wherein the first memory cell is coupled to the first data line and to a selected access line;
   determining an effect on a second data line due at least in part to the voltage applied to the first data line and a capacitive coupling between at least the first data line and the second data line without receiving a signal indicating the voltage applied to the first data line, wherein the second data line is coupled to a second memory cell, the second memory cell is adjacent to the first memory cell, and the second memory cell is coupled to the selected access line; and
   applying kink correction to the second data line, responsive to the determined effect, during a subsequent programming pulse applied to the second memory cell.

2. The method of claim 1, wherein the method includes floating the second data line while applying the one of the plurality of voltages.

3. The method of claim 1, wherein the method includes:
   selectively applying one of the plurality of voltages to a third data line according to a programming status of a third memory cell, wherein the third data line is coupled to the third memory cell, the third memory cell is adjacent to the second memory cell, and the third memory cell is coupled to the selected access line; and
   determining an effect on the second data line due at least in part to the voltage applied to the first data line and the voltage applied to the third data line.

4. The method of claim 1, wherein determining the effect on the second data line includes sensing a voltage on the second data line, wherein the voltage on the second data line is determined at least in part by the voltage applied to the first data line.

5. The method of claim 1, wherein determining the effect on the second data line includes determining the effect while the one of the plurality of voltages is applied to the first data line.

6. The method of claim 1, wherein the programming status is selected from the group of programming statuses including programming complete and programming incomplete.

7. The method of claim 1, wherein selectively applying one of the plurality of voltages includes:
   applying a first kink check voltage when the programming status of the first memory cell is programming incomplete; and
   applying a second kink check voltage when the programming status of the first memory cell is programming complete.

8. The method of claim 1, wherein applying kink correction to the second data line includes applying a kink correction voltage to the second data line.

9. The method of claim 8, wherein applying the kink correction voltage includes applying a voltage having a magnitude corresponding to a voltage sensed on the second data line.

10. The method of claim 9, wherein applying the kink correction voltage includes applying a voltage having a magnitude proportional to the voltage sensed on the second data line.

11. A method for operating a memory device, comprising:
    determining a number memory cells coupled to a common access line and adjacent to a first memory cell that will be program inhibited during a subsequent programming pulse, wherein the first memory cell is associated with a first data line;
    wherein the determining includes:
      applying a first voltage to a second data line when a second memory cell that is adjacent to the first memory cell and associated with the second data line has completed programming;
      applying a second voltage to the second data line when the second memory cell has not completed programming; and
      determining an effect on the first data line due at least in part to a capacitive coupling between at least the first data line and the second data line without receiving a signal indicating the second voltage applied to the second data line; and
    applying kink correction to the first data line according to the number of memory cells coupled to the common access line and adjacent to the first memory cell that will be program inhibited during the subsequent programming pulse.

12. The method of claim 11, wherein determining the effect on the first data line includes:
    sensing a first voltage when the number of memory cells coupled to the common access line and adjacent to the first memory cell that will be program inhibited during the subsequent programming pulse is zero;
    sensing a second voltage when the number of memory cells is one; and sensing a third voltage when the number of memory cells is two.

13. The method of claim 11, wherein applying kink correction includes applying the kink correction during the subsequent programming pulse.

14. The method of claim 11, wherein applying the kink correction includes increasing a voltage that is applied to the particular data line during a programming pulse.

15. The method of claim 14, wherein applying kink correction includes increasing the voltage that is applied to the first data line beyond an increase in voltage that is applied as part of a selective slow programming convergence (SSPC) technique.

16. The method of claim 11, wherein applying kink correction includes:
applying a first kink correction to the first data line when the number of memory cells coupled to the common access line and adjacent to the first memory cell that will be program inhibited during the subsequent programming pulse is one; and
applying a second kink correction to the first data line when the number of memory cells is two.

17. The method of claim 16, wherein a magnitude of the second kink correction is twice as large as a magnitude of the first kink correction.

18. The method of claim 16, wherein a magnitude of the second kink correction is equal to a magnitude of the first kink correction.

19. The method of claim 11, wherein applying kink correction according to the number of memory cells coupled to the common access line and adjacent to the first memory cell that will be program inhibited during the subsequent programming pulse includes applying no kink correction when the number of memory cells coupled to the common access line and adjacent to the first memory cell that will be program inhibited during the subsequent programming pulse is zero.

20. The method of claim 11, wherein determining the number of memory cells coupled to the common access line and adjacent to a first memory cell that will be program inhibited during a subsequent programming pulse includes determining the number of memory cells between programming pulses of a programming operation.

21. The method of claim 11, wherein determining the number of memory cells coupled to the common access line and adjacent to the first memory cell that will be program inhibited during a subsequent programming operation includes determining the number of memory cells before each programming pulse.

22. A method for operating a memory device, comprising:
floating a first data line;
applying a first voltage to a second data line if a memory cell coupled to the second data line and to a selected access line has completed programming;
applying a second voltage to the second data line if the memory cell coupled to the second data line and to the selected access line has not completed programming; and
sensing an effect on the first data line due at least in part to a capacitive coupling between at least the first data line and the second data line without receiving a signal indicating the second voltage applied to the second data line;
floating the second data line;
applying the first voltage to the first data line if the memory cell coupled to the first data line and to the selected access line has completed programming;
applying the second voltage to the first data line if the memory cell coupled to the first data lien and to the selected access line has not completed programming;
sensing an effect on the second data line due at least in part to a capacitive coupling between at least the second data line and the first data line without receiving a signal indicating the first voltage applied to the first data line;
applying kink correction to the first data line according to the effect sensed on the first data line; and
applying kink correction to the second data line according to the effect sensed on the second data line.

23. A memory device, comprising:
a first data line associated with a first memory cell and a first control element;
a second data line associated with a second memory cell and a second control element, wherein the second memory cell is adjacent to the first memory cell;
wherein the first control element is configured to:
apply a first voltage to the first data line if the first memory cell has completed programming; and
apply a second voltage to the first data line if the first memory cell has not completed programming; and
wherein the second control element is configured to determine an effect of the application of the voltage on the first data line on the second data line due at least in part to a capacitive coupling without receiving a signal indicating the first voltage applied to the first data line.

24. The device of claim 23, wherein the device includes a third data line associated with a third memory cell and a third control element, wherein the third memory cell is adjacent to the second memory cell;
wherein the third control element is configured to:
apply the first voltage to the third data line if the third memory cell has completed programming; and
apply the second voltage to the third data line if the third memory cell has not completed programming; and
wherein the second control element is configured to determine an effect of the application of the voltage on the third data line on the second data line due at least in part to a capacitive coupling.

25. The device of claim 23, wherein the second control element is configured to float the second data line during application of the voltage to the first data line.

26. The device of claim 23, wherein the second control element being configured to determine the effect comprises the second control element being configured to sense a voltage on the second data line due at least in part to the capacitive coupling, wherein the capacitive coupling is between at least the first data line and the second data line.

27. The device of claim 23, wherein the second control element is configured to apply a kink correction voltage to the second data line during a programming operation of the second memory cell according to the determined effect.

28. The device of claim 27, wherein the kink correction voltage comprises a voltage substantially equivalent to an increase in voltage applied to a control gate of the second memory cell during a programming pulse thereon due at least in part to capacitive coupling between at least the first data line and the second data line.

29. The device of claim 23, wherein:
the second control element includes a number of decoded storage elements; and
the second control element is configured to select one of the number of decoded storage elements to apply a corresponding voltage to the second data line during a programming pulse.

30. The device of claim 29, wherein the corresponding voltage is selected from the group of corresponding voltages including:
   zero volts;
   ½ kink correction voltage;
   kink correction voltage;
   selective slow programming convergence (SSPC) voltage;
   SSPC voltage+½ kink correction voltage;
   SSPC voltage+kink correction voltage; and
   inhibit voltage.

31. The device of claim 23, wherein:
   the second control element includes a number of encoded storage elements; and
   the second control element is configured to select a combination of the number of encoded storage elements to apply a corresponding voltage to the second data line during a programming pulse.

32. The device of claim 23, wherein the second control element is located on an opposite side of the memory device from the first control element.

33. The device of claim 23, wherein the second control element is coupled to an opposite end of the second data line with respect to an end of the first data line to which the first control element is coupled.

34. The device of claim 23, wherein:
   the second control element includes five decoded storage elements; and
   the second control element is configured to select one of the five decoded storage elements to apply a corresponding voltage to the second data line during a programming pulse.

35. The device of claim 34, wherein the corresponding voltage is selected from the group of corresponding voltages including:
   zero volts;
   kink correction voltage;
   selective slow programming convergence (SSPC) voltage;
   SSPC voltage+kink correction voltage; and
   inhibit voltage.

36. The device of claim 23, wherein the first data line is a first bit line and wherein the second data line is a second bit line.

37. The device of claim 23, wherein the first control element and the second control element include and/or are coupled to control circuitry.

38. The device of claim 37, wherein the control circuitry includes sensing circuitry selectively coupled to a respective data line by a first switching device, wherein the sensing circuitry includes:
   a temporary data cache (tdc) node selectively coupled to precharging circuitry by a second switching device;
   the tdc node selectively coupled to a latch by a third switching device; and
   the tdc node coupled to a capacitance.

39. The device of claim 38, wherein the capacitance is:
   selectively coupled to ground by a fourth switching device;
   selectively coupled to boosting circuitry by a fifth switching device; and
   selectively coupled in series with another capacitance to ground by a sixth switching device.

40. A memory device, comprising:
   a first memory cell coupled to a first data line and to a selected access line;
   a second memory cell coupled to a second data line and to the selected access line, wherein the second memory cell is adjacent to the first memory cell;
   a first control element associated with the first data line, wherein the first control element is configured to selectively apply one of a plurality of voltages to the first data line according to a programming status of the first memory cell; and
   a second control element associated with the second data line, wherein the second control element is configured to:
      determine an effect on the second data line due at least in part to the voltage applied to the first data line and a capacitive coupling between at least the first data line and the second data line without receiving a signal indicating the voltage applied to the first data line; and
      apply kink correction to the second data line, responsive to the determined effect, during a subsequent programming pulse applied to the second memory cell.

41. The device of claim 40, wherein the second control element is configured to float the second data line while applying the one of the plurality of voltages.

42. The device of claim 40, wherein the device includes:
   a third data line coupled to a third memory cell, wherein the third memory cell is adjacent to the second memory cell, and the third memory cell is coupled to the selected access line; and
   a third control element associated with the third data line, wherein the third control element is configured to selectively apply one of the plurality of voltages to the third data line according to a programming status of the third memory cell;
   wherein the second control element is configured to determine an effect on the second data line due at least in part to the voltage applied to the first data line and the voltage applied to the third data line.

43. The device of claim 40, wherein the second control element being configured to determine the effect on the second data line includes the second control element being configured to sense a voltage on the second data line, wherein the voltage on the second data line is determined at least in part by the voltage applied to the first data line.

44. The device of claim 40, wherein the second control element being configured to determine the effect on the second data line includes the second control element being configured to determine the effect while the one of the plurality of voltages is applied to the first data line.

45. The device of claim 40, wherein the programming status is selected from the group of programming statuses including programming complete and programming incomplete.

46. The device of claim 40, wherein the first control element being configured to selectively apply one of the plurality of voltages includes the first control element being configured to:
   apply a first kink check voltage when the programming status of the first memory cell is programming incomplete; and
   apply a second kink check voltage when the programming status of the first memory cell is programming complete.

47. The device of claim 40, wherein the second control element being configured to apply kink correction to the second data line includes the second control element being configured to apply a kink correction voltage to the second data line.

48. The device of claim 47, wherein the second control element being configured to apply the kink correction voltage includes the second control element being configured to apply a voltage having a magnitude corresponding to a voltage sensed on the second data line.

49. The device of claim 48, wherein the second control element being configured to apply the kink correction voltage includes the second control element being configured to apply a voltage having a magnitude proportional to the voltage sensed on the second data line.

* * * * *

UNITED STATES PATENT AND TRADEMARK OFFICE
CERTIFICATE OF CORRECTION

PATENT NO. : 8,482,975 B2
APPLICATION NO. : 12/559275
DATED : July 9, 2013
INVENTOR(S) : Uday Chandrasekhar et al.

It is certified that error appears in the above-identified patent and that said Letters Patent is hereby corrected as shown below:

In the Claims:

In column 22, line 2, in Claim 22, delete "lien" and insert -- line --, therefor.

Signed and Sealed this
Seventeenth Day of September, 2013

Teresa Stanek Rea
*Deputy Director of the United States Patent and Trademark Office*